United States Patent [19]

Keren

[11] Patent Number: 4,757,290

[45] Date of Patent: Jul. 12, 1988

[54] HYBRID RESONATOR

[75] Inventor: Hannan Keren, Kfar Saba, Israel

[73] Assignee: Elscint Ltd., Haifa, Israel

[21] Appl. No.: 11,630

[22] Filed: Feb. 6, 1987

[30] Foreign Application Priority Data

Feb. 20, 1986 [IL] Israel ........................................ 77937

[51] Int. Cl.⁴ ........................ H01P 7/20; G01R 33/20
[52] U.S. Cl. .................................... 333/219; 333/235;
324/318; 324/322; 335/299
[58] Field of Search ............... 333/167, 219, 235, 245,
333/220–223, 227, 231; 324/311, 316, 318, 320,
321, 322, 307, 308, 309, 310, 312, 313; 335/299,
301

[56] References Cited

U.S. PATENT DOCUMENTS 4,594,566 6/1986 Maudsley ............................ 333/235

Primary Examiner—Marvin L. Nussbaum
Attorney, Agent, or Firm—Sandler & Greenblum

[57] ABSTRACT

A circularly polarized radio frequency probe for use in magnetic resonance systems, the probe comprises four effective "saddle coils" arranged to define a single cylinder. The saddle coils each comprise a pair of 120 degree arcuate conductor sectors separated by longitudinal conductors. RF power is coupled to each of said "saddle coils" so that first and second pairs of saddle coils generate first and second fields normal to each other.

13 Claims, 2 Drawing Sheets

HYBRID RESONATOR

FIELD OF THE INVENTION

This invention is concerned with magnetic resonance systems including magnetic resonance imaging systems and magnetic resonance spectroscopic systems and more particularly with the radio frequency probes used in such systems.

BACKGROUND OF THE INVENTION

Magnetic resonance systems acquire data using strong magnets for providing large static magnetic fields. Gradient coils are provided to "focus" the magnetic fields. The gradient coils and the large static magnetic fields are used to magnetically align nuclei in a desired plane of the sample being imaged or spectrographically studied. A radio frequency (Rf) pulse is used to nutate the nuclei. When the Rf pulse terminates the nutated nuclei precess and return to the aligned condition. As the nuclei precess and return to the aligned state, the movement of the nuclei in the magnetic field generate what are known as free induction decay (FID) signals. It is the FID signals that are most popularly used for imaging and spectrographic purposes.

Special Rf coils or probes are used for transmitting Rf pulses or receiving the Rf FID signals. These probes are energized in the transmitting state with an Rf pulse having a frequency known as the Larmor frequency, which as is well known, is a function of the particular element and the magnetic field strength. The Larmor frequency is also the precessional angular frequency and the frequency of the FID signals.

While any type of magnet can be used to generate the large static field, in a preferred embodiment, a superconducting magnet is used. The specimen or patient is placed within the bore of the superconducting magnet for uniform exposure to the large static magnetic field. The Rf probes are either body probes wherein the entire body of the patient can be within the probe or probes designed to be juxtaposed to particular portions of the body such as the limbs or the head.

The probes must be capable of: resonating at the desired RF frequency; generating homogeneous magnetic fields, and not adding excessive noise to the pulses transmitted or the signals received.

Nothwithstanding the relative efficiency of the proximate probes, the signal to noise ratio (SNR) of the acquired data remains critical because of the very small amplitudes of the FID signals. The SNR decreases because among other things, of unbalances due to stray capacitances in the probes themselves and because of variations in the impedances of the probes when loaded by the patient or sample.

Different patients have different body impedances and therefore load the Rf probes differently. Also the human body, for example, or the specimens themselves in spectroscopic work are not generally considered as being symmetrical bodies. Thus, loading is non-symmetrical loading, and results in variations in the signals received from the probes. Also the probes are variable, among other ways, in that the impedance thereof change with temperature and relative humidity among things.

Another problem encountered in the use of the prior art Rf probes and especially with the larger body probes is that they have relatively low self-resonant frequencies which limit the top frequency that can be used as the Larmor frequency. It has been found that with the stronger fields, such as the 2 Telsa fields, for example, better resolution is obtained in the image. However, since increasing the magnetic strength of the field, increases the Larmor frequency, the self resonant frequencies of the probes tend to be a limiting factor in the magnetic strength that can be used.

Another serious problem, faced by the scientists and designers of MR systems is that the Rf power transmitted by the probes may cause heating of the samples or sections in patients being examined. That is because only a very small portion of the Rf power nutates the nuclei while most of the power causes eddy and dielectric currents in the tissues of the subject which generate heat. This is a "microwave oven" effect. As a matter of fact, the Federal Drug Administration (FDA) in the United States has set a limit on the specific power absorption rate (SAR) of the Rf signal that can be used in imaging humans. The set limit is 0.4 watts per kilogram. Thus, there is a limit on the power that can be used in the Rf probes as a function of the patient's weight. This limit is designed to safeguard the patient from undergoing microwave caused heating damage to tissues.

Most of the probes used in the past were often saddle shaped coils and were linearly polarized. That is the magnetic fields provided by the probes were normal to one of the planes defined by two of the orthogonal axis of the magnet of the MR system. Generally speaking the MR systems are viewed as being XYZ orthogonal systems with the large static magnetic fields assumed to be in the Z direction and the Rf fields assumed to be perpendicular to the XZ plane. The nutated nuclei or spins precess around the Z axis for example, and the effective projection or linear polarization is in the XY plane, while the spins are processing. In the past, due to the linear polarization by the applied Rf pulses, one-half of the generated magnetic lines did not pass through the subject. Accordingly half of the Rf power was not effectively used to nutate the spins.

Still another problem is that the presently available Rf probes cause what are known as radio frequency penetration artifacts to appear mainly on the body images as shaded areas. The artifacts result from standing waves of the RF radiation passing through the tissue at high frequencies which distort the uniformity of the applied radio frequency magnetic field. To attempt to overcome this problem the prior art has implemented an excitation mode wherein the polarization is circular rather than linear. (See an article entitled "An Efficient Highly Homogeneous RF Coil for Whole Body Imaging at 1.5T" by C. E. Hayes et al in the Journal of Magnetic Resonance 163.622–628 (1985)). This mode is also sometimes referred to as a "quadrature mode". The circular polarization in addition to improving image quality reduces the power required to achieve a given nutation of the spins. Accordingly smaller Rf power amplifiers can be used. Also less energy is absorbed by the patient thereby obviating the problem of possibly exceeding the 0.4 watts per kilogram SAR. The sensitivity of the receiver coils to the FID signals are also greater with circular polarization by an amount that increases the signal to noise ratio by a factor of the square root of 2. The circular polarization decreases the Rf power necessary by a factor of 2.

A problem with the circular or quadrature mode equipment has been that the homogeneity of the generated field within the center of the subject does not match the homogeneity of the fields generated by the saddle coils. A related problem with quadrature mode equipment has been in providing coils that can generate the circularly polarized Rf fields without being unduly influenced by loading of the probe due to the patient within coil. The quadrature mode generating equipment is in general unduly influenced by the cross-coupling between the multiple coils that are used to generate the circular polarization.

The prior art attempts at accomplishing circular polarization or quadrature excitation has been accomplished using what is commonly referred to as "bird cage" resonators. The bird cage resonator comprises a pair of spaced apart circular end loops surrounding the patient or the portion of the patient being imaged. The circular spaced apart loops are joined by a plurality of straight conductors or rods defining the length of the probe. One version of the bird cage resonantor has tuning capacitors along the length of each of the rods and matching capacitor along one of the rods. The power input is attached across the matching capacitor. This is known as a low pass bird cage resonator.

Another version of the bird cage resonantor uses rods without the capacitors between the oppositely disposed circular end loops and instead breaks up the circular end loops with capacitors between the rods. This version is known as the high pass bird cage resonator.

As previously mentioned a major problem with bird cage resonator body probes is that they are very suspectible to adverse loading by the body. They repeatedly work fine as long as the subject is a phantom that is completely symmetrical. When a patient is the subject within the bird cage resonator then the inherent lack of symmetry unequally loads the probe and causes artifacts in the images, decreases the signal to noise ratio and requires greater power.

A prior art attempt at combining saddle coils and quadrature polarization is described in an article entitled "Quadrature Detection in the Labratory Frame", by D. I. Hoult et al published in Magnetic Resonance in Medicine, Vol. 1, pp. 339–351 (1984). The article describes a plurality of overlapping saddle coils, which theoretically can be used in quadrature. Implementation of the theory has proven difficult.

Accordingly scientist in the field are still seeking efficient probes for use in MR systems which provide circular polarization.

BRIEF DESCRIPTION OF THE INVENTION

Accordingly, it is an object of the present invention to provide circularly polarized radio frequency probes for use in MR systems, having large static magnetic fields directed along a first axis, said probes comprising means including four saddle coils preferrably arranged defining a single cylinder coaxial with said first axis. The saddle coils each comprising a pair of effective 120 degree arcuate conductor sections separated by longitudinal conductors, and means for coupling Rf power to each of said loops so that said first and second pair of saddle loops generate first and second fields respectively normal to said longtitudinal axis and to each other.

A feature of the invention comprises means for coupling Rf power to each of the said saddle coils so that said first and second pair of saddle coils generate first and second fields respectively normal to said first axis and to each other.

A further feature of the invention comprises varying the input to the first pair of saddle coils as a cosine function for example, while varying the input to the second pair of saddle coils as a sine function. This provides a vector sum that is rotating about the axis of the cylinder, for example, which is the direction of the nutation of the spins. The invention reduces by a factor of two the radiated power necessary to nutate the spins.

Yet another feature of the invention is in providing as means for inserting four saddle coils into single cylindrical space, a pair of circular end loops spaced apart from each other and symmetrically placed around the longtitudinal axis of the cylindrical space, a first and a second pair of longitudinal coils being coupled to said first and second circular end loops at points that are 90 degrees apart from each other. Current is provided to the first and second pair of longitudinal coils in a manner such that the magnetic field generated by the current in the circular end loops and the current in portions of the first and second pairs of longitudinal coils that are parallel and adjacent to said circular end loops cancel each other; thereby, providing isolation between the individual longitudinal coils of the sequential saddle coils.

A further and related feature of the invention provides for the coupling of the longitudinal coils at points of zero potential difference, of the standing wave, generated by alternate pairs of saddle coils whereby isolation is perfected, as opposed, for example, to bird cage resonators wherein the isolation depends upon the current being evenly distributed in each of the longtitudinal conductors. In practice, the current is affected by factors such as loading and the actual differences in the impedances of the conductors to the high frequency radio signals so that the current is not in fact evenly distributed in the longitudinal conductors, and therefore cancellation and isolation do not actually occur.

Still a further related object of the invention is to isolate the longitudinal rectangular-like coils to enable use of the different pairs of coils at different frequencies in linear polarization modes without the necessity of returning the coils for such different frequencies.

The above mentioned features and objects of the present invention will be best understood when considered in conjunction with the following description of a broad aspect of present invention. The description refers to the accompanying drawings of the improved radio frequency probe of the invention; wherein:

GENERAL DESCRIPTION

Figure 1:
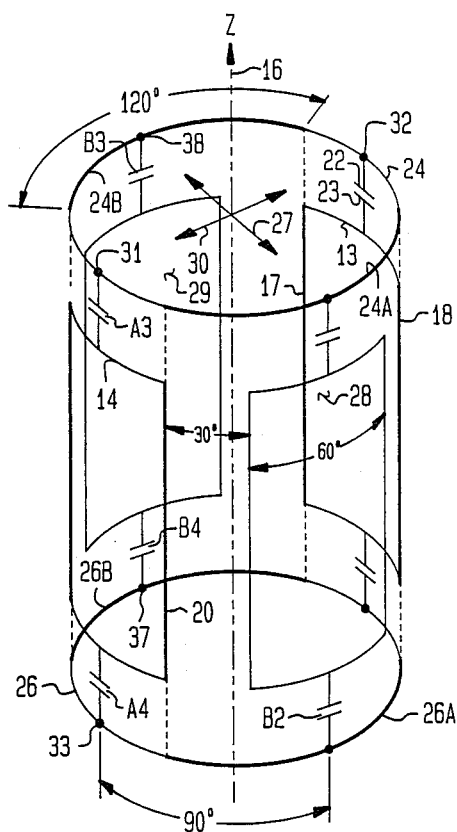
FIG. 1 is a schematic showing of the inventive improved Rf probe, having four longtitudinal coils connected between two oppositely disposed circular end coils.

The probe 11 of FIG. 1 is shown as comprising a plurality of pairs of oppositely disposed pairs of longtitudinal rectangular-like loops or coils. More particularly a first longtitudinal loop 13 and a second longtitudinal loop 14 are shown as being spaced apart from each other on opposite sides of an axis 16 of an imaginary cylinder. The axis 16 is as a matter of fact preferrably aligned with the Z axis of the cartesian coordinate system regularly used with MR systems, where the Z axis is the direction of the large static magnetic field.

The longtitudinal loop 13 is exemplary of all four longtitudinal loops and therefore will be described in detail. Loop 13 is the one loop of the pair of longtitudinal rectangular-like loops made up of loops 13 and 14. Loop 13 for example comprises a pair of longtitudinal conductors 17 and 18 parallel to each other and joined together by oppositely disposed transverse conductors 19 and 21. The transverse conductors are arcuate to match the circumference of the generally cylindrical shape of the coil. The configuration of these conductors is such as to provide two pair of coils effectively having the well known saddle shape. It is believed that saddle shaped coils provide the most homogeneous fields. A problem until now has been that since saddle coils comprise pairs wherein each coil takes up 120 degrees only one pair of saddle coils could be used per 360 degrees.

The rectangular-like longitudinal coil is shown as including power coupling capacitor sections A1 and A2. Therein a pair of coupling conductors 22 and 23 are shown connected on either side of a capacitor arrangement shown as A1. The capacitor arrangement is shown and described in greater detail with the description of FIG. 3.

The longitudinal coils are joined together at least physically by circular end coils 24 and 26. The circular end coils are symmetrical about the axis 16 and spaced apart the length of the probe.

The coils 13 and 14 receive Rf power in a manner such that a varying magnetic field H1* cos (wt) is generated responsive to the current flowing in the coils 13 and 14. The direction of the magnetic field is shown by the arrow 27. The magnetic field is perpendicular to the Z axis or axis 16.

The current in the other pair of longitudinal rectangular-like coils 28 and 29 generates a varying magnetic field HZ* cos(wt) in the direction of the arrow 31. Note that the magnetic field H2 is perpendicular to the magnetic field H1 of the first pair of longitudinal rectangular-like coils and also perpendicular to the axis 16. Each coil of each of the pairs of longitudinal coils have centers that are 180 degrees from the center of the other longitudinal coil of the pair. Each of the longitudinal coils have centers which are substantially 90 degrees from the centers of the adjoining longitudinal coils. The coils themselves extend over an arc of 60 degrees. The longitudinal coils are separated from each other by 30 degrees.

The four effective saddle coils are comprised of portions of the circular end coils and portions of the longitudinal rectangular-like coils. For example, a first effective saddle coil comprises the portion 24a of circular end coil 24 that is heavily lined and the corresponding heavily lined portions 24a, 26a of end coils 24 and 26. Portions 24a and 26a extend over arcs of 120 degrees. The longitudinal conductors of the first effective saddle coil are conductor 18 of longitudinal coil 13 and conductor 20 of longitudinal coil 14.

The second effective saddle coil is the other saddle coil of the first pair of saddle coils. It is comprised of heavily lined portion 24b of end coil 24 and heavily lined portion 26b of end coil 26. The longitudinal conductors are the conductors 17 of coil 13 and conductor 30 of coil 14. Note that the saddle coils have the optimal saddle coil geometry i.e. extending over an arc of 120 degrees and spaced apart by 60 degrees.

The other pair of effective saddle coils similarily extend from opposite longitudinal conductors of longitudinal coils 28 and 29.

Means are provided for causing the vector sum of the magnetic fields generated by each pair of effective saddle coils to rotate about the Z axis. Each of the pairs of saddle coils is provided with power that varies in accordance with a sin or cos function. More particularly the loops 13 and 14 receive current Icos(wt) while loops 28 and 29 receive current Isin(wt), for example. The vector sum of the magnetic field generated by the power input is a rotating vector about the Z axis. The spins are nutated about the axis by the applied magnetic fields. The applied magnetic fields are more effective in nutating the spins, when the applied field also nutate or rotate about the Z axis, thereby reducing the power requirements.

Figure 2:
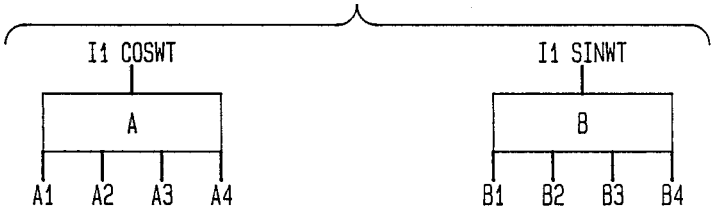
FIG. 2 is a schematic showing of the actual connection of the RF power.
Figure 3:
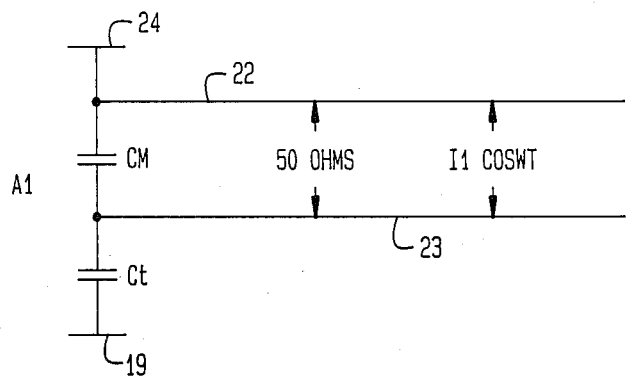
FIG. 3 is a schematic showing of the power connection to an exemplary one of the longtitudinal coils.
Figure 4:
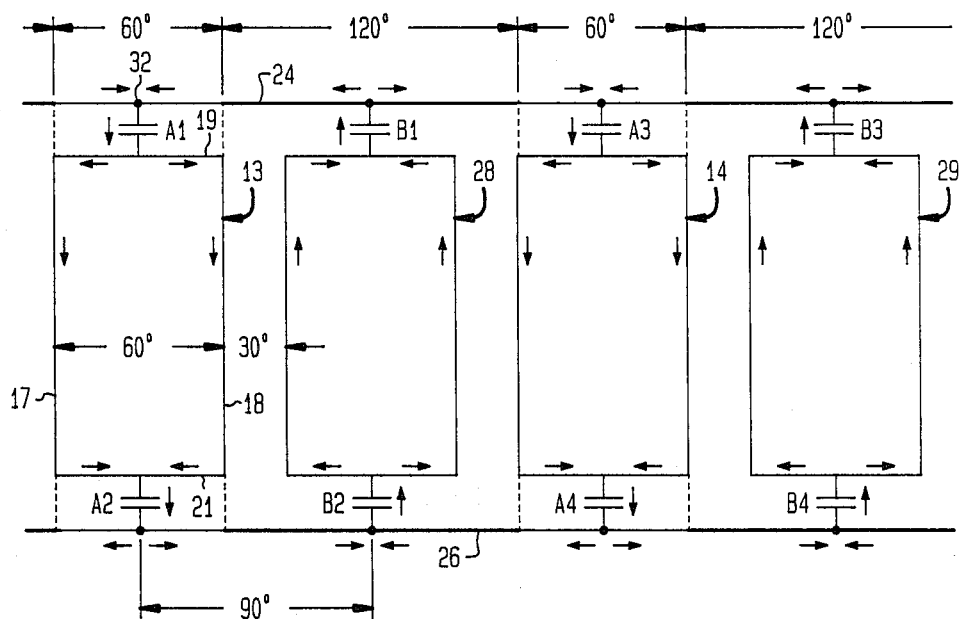
FIG. 4 is a schematic showing of the current flow in the coils of FIG. 1.

The actual connection of the power is indicated in FIG. 2. FIG. 2 shows each of the capcitor coupling points connected to a power source. The capacitor coupling points shown as capacitors A1, A2, A3, A4, B1, B2, B3 and B4, actually each comprise two serially joined capacitors, as shown in FIG. 3. A first capacitor Cm is a matching capacitor for matching of the coil to the line impedance. The line impedance in a preferred embodiment is 50 ohms. The second capacitor Ct is a tuning capacitor tuned to the desired frequency. Each of the sets of capacitors are the same in the symmetrical arrangement shown schematically in FIG. 1. In practice one coupling point could be used per pair of effective saddle coils. In such a case the other A and B points would comprise only the tuning capacitors.

Means are provided for using each longitudinal rectangular-like coil in conjunction with the circular end coil to provide the effective saddle coils and to set up isolating standing waves. More particularly, consider the connection 31, 32 of the oppositely disposed longitudinal coils 13 and 14 to circular end coil 24 and the connections 33 and 36 to the circular end coil 26. Note that the potential is zero halfway between the connections 31 and 32 in the circular end coil 24 and the connections 33 and 36 in the circular end coil 26. Thus, the potentials at the connection points 37 and 38 are zero with respect to the power provided at capacitor coupling arrangement indicated as A1, A2, A3 and A4. Hence even a short circuit connected between points 37 and 38 for example, will have no effect whatsoever on the power flow through the first pair of effective saddle coils 13 and 14.

The power coupled to points B1, B2, B3 and B4 is similarly such that the potential differences at points 31 and 32 and the potential differences of points 33 and 36 due to the potentials applied to B1, B2, B3 and B4 are zero. Hence a short circuit connected between coupling points 32 and 36 and a short circuit connected between coupling points 31 and 33 would have no effect on the power flowing through the second pair of longitudinal saddle loops 28 and 29. Therefore isolation between the pairs of effective saddle coils is provided.

Means are provided for creating the effective saddle coils extending for 120 degrees. More particularly, the instantaneous polarities at the power coupling arrangements of A1, A2, A3, A4, and at B1, B2, B3, and B4 are such that currents flowing through circular end coil 24 and transverse conductor 19 for example are equal and opposite so that there is no magnetization generated by the currents in loop 24 opposite conductor 19, since the general magnetic fields are cancelled and the induction of those portions of the coils add up to zero. The cancellation also assures that there is no cross magnetization between the coils 13, 28 or 14 and 29. Substantially perfect isolation is achieved, thereby enabling the use of four effective saddle coils in generating the rotating magnetic fields to nutate the spins in the direction of the rotation.

A synergistic benefit of the isolation between the pairs of coils is that the different pairs of coils can be tuned to different frequencies. With such an arrangement, different elements i.e. sodium or phosphate can be resonated without having to retune the coils.

In operation the hybrid resonator probe is comprised of a pair of circular end coils spaced apart from each other and symmetrical about the Z axis. Two pairs of longitudinal coils are provided and symmetrically arranged around an imaginary cylindrical body. The oppositely disposed longtitudinal coils each cause a varying magnetic field to be generated. The fields are normal to each other and also normal to the Z axis of the MRI system. The Z axis is preferrably co-axial with the longtitudinal axis of the imaginary cylinder. The two magnetic fields when added together provide a magnetic field that rotates about the Z axis. The arrangement enables using lower RF power for nutating the spins by a factor of 2. The ability to use lower power alleviates or practically eliminates the problem of eddy current heat generation in the subject. Also the SNR is increased by a factor of square root of two. The sensitivity of the receiver probe to the MR signal is also greater because of the physical alignment of the quadrature loops. Thus an improved, circularly polarized body probe is provided which enables using higher frequencies, or lower power or different frequencies without having to retune the probes.

While the invention has been described using particular embodiments it should be understood that these embodiments are exemplary only and not limitations on the scope of the invention.

What is claimed is:

1. A hybrid resonator for use as a radio frequency probe in magnetic resonance (MR) systems,
   said systems having large static magnetic field extending in a longitudinal direction in a cylinder,
   said resonator comprising a pair of oppositely disposed spaced apart circular end coils,
   said end coils each being concentric about the same axis to thereby define a cylindrical shape,
   four longitudinal coils disposed between said circular end coils symetrically spaced apart around said cylindrical shape,
   each of said longitudinal coils comprising a pair of spaced apart longitudinal conductors,
   a pair of transverse conductors joining the longitudinal conductors at opposite ends thereof,
   said transverse conductors being adjacent and parallel to portions of said circular end coils,
   means for connecting each of said longitudinal coils to both of said circular end coils,
   capacitor means for tuning the hybrid resonator to the desired resonance frequency, and
   means for connecting radio frequency power to said hybrid resonator.

2. The hybrid resonator of claim 1 wherein said means for connecting each of said longitudinal coils to both of said circular end coils comprises means for connecting each of said transverse conductors at the midpoint thereof to said adjacent circular end coils.

3. The hybrid resonator of claim 2 wherein said capacitor means is located in the means for connecting each of said transverse conductors to said adjacent circular end coil.

4. The hybrid resonator of claim 3 wherein said means for connecting radio frequency power to said hybrid resonator comprises means for coupling a first RF source to one pair of oppositely disposed longitudinal coils and means for connecting a second RF source to the other pair of oppositely disposed longitudinal coils, and
   said first Rf source being 90 degrees out of phase with said second Rf source.

5. The hybrid resonator of claim 3 wherein said capacitor means comprises a matching capacitor in series with a tuning compacitor, and
   wherein said means for connecting power comprises connecting said Rf sources across said matching capacitors.

6. The hybrid resonator of claim 3 wherein said capacitor means comprises a matching capacitor and a tuning capacitor in series with the matching capacitor where said RF sources are connected.

7. The hybrid resonator of claim 3 wherein said capacitor means comprises only a tuning capacitor unless said Rf is connected thereto, said tuning capacitor being the means for connecting said longitudinal coils to said circular end coils.

8. The hybrid resonator of claim 1 wherein said longitudinal coils each extend over an arc of 60 degrees and are separated from each other by an arc of 30 degrees.

9. The hybrid resonator of claim 1 wherein the points of connecting said longitudinal coils to said circular end coils are separated by 90 degrees.

10. The hybrid resonator of claim 1 wherein said Rf sources are connected so that the current in said circular end coils is opposite in direction than the current in the adjacent transverse conductors of said longitudinal coils.

11. The hybrid resonator of claim 1 wherein said RF power is connected so that current in adjacent ones of said longitudinal conductors of different ones of said longitudinal coils run in opposite directions.

12. A hybrid resonator for use as a radio frequency (RF) coil in a magnetic resonance (MR), said system having a large static magnet extending in a longitudinal direction in a cylinder, said resonator comprising a pair of oppositely disposed spaced apart circular end coils, said end coils being concentric about the same axis to thereby define a cylindrical shape, four longitudinal coils disposed between said circular end coils symmetrically spaced apart around said cylindrical shape and arranged to provide in cooperation with said circular end coils saddle coils symmetrically spaced around said cylindrical shape, said longitudinal coils extending for 60 degrees, said saddle coils being comprised of longitudinal members of oppositely disposed ones of said longitudinal coils being separated by an arc of 120 degrees, and each of said saddle coils being oppositely disposed from another saddle coil and spaced apart from each other by the 60 degree extension of said longitudinal coils.

13. The hybrid resonator of claim 14 including means for tuning said hybrid resonator to the desired RF, means for connecting RF power to said hybrid resonator in a manner to electromagnetically isolate each of said pair of saddle coils from the other pair of saddle coils whereby each pair of saddle coils can be tuned to a different RF for activating a different element in an object being subjected to magnetic resonance diagnosis in the MR system.

* * * * *